(12) United States Patent
Huang et al.

(10) Patent No.: US 7,164,189 B2
(45) Date of Patent: Jan. 16, 2007

(54) SLIM SPACER DEVICE AND MANUFACTURING METHOD

(75) Inventors: Chien-Chao Huang, Hsin-Chu (TW); Tone-Xuan Chung, Kaohsiung (TW); Fu-Liang Yang, Hsin-Chu (TW)

(73) Assignee: Taiwan Semiconductor Manufacturing Company Ltd, Hsin-Chu (TW)

( * ) Notice: Subject to any disclaimer, the term of this patent is extended or adjusted under 35 U.S.C. 154(b) by 0 days.

(21) Appl. No.: 10/816,089

(22) Filed: Mar. 31, 2004

(65) Prior Publication Data

US 2005/0224867 A1  Oct. 13, 2005

(51) Int. Cl.
*H01L 29/78* (2006.01)
(52) U.S. Cl. ............... 257/632; 257/344; 257/E29.266
(58) Field of Classification Search ........... 257/288, 257/344, 382–384, 408, 412, 413, 638–640, 257/649, 900, 632, E29.266
See application file for complete search history.

(56) References Cited

U.S. PATENT DOCUMENTS

| | | | | |
|---|---|---|---|---|
| 6,046,494 A * | 4/2000 | Brigham et al. | ............ | 257/640 |
| 6,140,192 A * | 10/2000 | Huang et al. | ............... | 438/305 |
| 6,566,254 B1 * | 5/2003 | Mikagi | ..................... | 438/660 |
| 6,656,853 B1 * | 12/2003 | Ito | .............................. | 438/778 |
| 6,897,526 B1 * | 5/2005 | Miyanaga et al. | ........... | 257/345 |
| 6,927,117 B1 * | 8/2005 | Cabral, Jr. et al. | ............ | 438/233 |

FOREIGN PATENT DOCUMENTS

JP  11233769 A  *  8/1999

* cited by examiner

*Primary Examiner*—Marcos D. Pizarro
(74) *Attorney, Agent, or Firm*—Tung & Associates

(57) ABSTRACT

A CMOS structure including a Slim spacer and method for forming the same to reduce an S/D electrical resistance and improve charge mobility in a channel region, the method including providing a semiconductor substrate including a polysilicon gate structure including at least one overlying hardmask layer; forming spacers selected from the group consisting of oxide/nitride and oxide/nitride oxide layers adjacent the polysilicon gate structure; removing the at least one overlying hardmask layer to expose the polysilicon gate structure; carrying out an ion implant process; carrying out at least one of a wet and dry etching process to reduce the width of the spacers; and, forming at least one dielectric layer over the polysilicon gate structure and spacers in one of tensile and compressive stress.

25 Claims, 5 Drawing Sheets

SLIM SPACER DEVICE AND MANUFACTURING METHOD

FIELD OF THE INVENTION

This invention generally relates to processes for forming semiconductor devices including CMOS and MOSFET devices and more particularly to a CMOS device and method for forming the same having a Slim spacer with improved electrical performance including reduced short channel effects and increased charge carrier mobility.

BACKGROUND OF THE INVENTION

As MOSFET and CMOS device characteristic sizes are scaled below 0.25 microns including below 0.1 micron, the device designs need to be modified for each generation of device scaling down. For example, short channel effects (SCE) are one of the most important challenges for designers to overcome as device critical dimensions are scaled down. Among the many manifestations of SCE, are Voltage threshold ($V_T$) rolloff, drain induced barrier lowering (DIBL), and subthreshold swing variation.

Source/Drain (S/D) junction depth and channel doping are some of the few parameters that can be changed to reduce SCE. Since the source drain extension (SDE) implants are self-aligned to the gate edge, the junction depth of the S/D regions is typically scaled to the gate length ($L_G$). One problem with reducing junction depth is the effect of increasing the S/D region sheet resistance, which reduces drive current ($I_D$).

One approach to reducing the increase in S/D sheet resistance with shallower junction depths is to form salicides over the S/D regions. However, the width of spacers which mask an underlying lightly doped regions also referred to as source drain extension (SDE) regions during a S/D implant process have the effect of reducing the amount of salicide that may be formed over the S/D and SDE regions. Therefore, while it may be desirable to have a desired spacer width and a desired underlying SDE region width, the spacer width limits the degree of lowering the sheet resistance of the S/D region by salicide formation leading to lower drive current ($I_D$).

In addition, as gate lengths become smaller, for example less than about 80 nanometers, conventional processes for forming spacers are no longer adequate to precisely position the S/D implant regions, thereby leading to increased SCE. In some approaches in the prior art, disposable spacers have been proposed to address the problem of having a desirable spacer width to form a desired S/D region and subsequent salicide width to lower S/D region sheet resistance. Among the shortcomings of disposable spacers includes costly and complicated processes requiring extra process steps which undesirably decreases throughput and adds to cost. In addition, disposable spacers lead to reduced control in forming a selected level of tensile or compressive stresses in the channel region to achieve improved charge mobility.

There is therefore a need in the semiconductor integrated circuit manufacturing art for an improved method for forming dielectric spacers to achieve desired dimensions while reducing S/D region electrical resistance and associated SCE effects while increasing charge mobility at acceptable process throughput and process cost.

It is therefore among the objects of the present invention to provide an improved method for forming dielectric spacers to achieve desired dimensions while reducing S/D region electrical resistance and associated SCE effects while increasing charge mobility at acceptable process throughput and process cost, as well as overcoming other shortcomings of the prior art.

In another approach, strain in the channel is introduced after the transistor is formed. In this approach, a high stress film is formed over a completed transistor structure formed in a silicon substrate. The high stress film or stressor exerts significant influence on the channel, modifying the silicon lattice spacing in the channel region, and thus introducing strain in the channel region. In this case, the stressor is placed above the completed transistor structure. This scheme is described in detail in a paper by A. Shimizu et al., entitled "Local mechanical stress control (LMC): a new technique for CMOS performance enhancement," published in pp. 433–436 of the Digest of Technical Papers of the 2001 International Electron Device Meeting, which is incorporated herein by reference.

SUMMARY OF THE INVENTION

To achieve the foregoing and other objects, and in accordance with the purposes of the present invention, as embodied and broadly described herein, the present invention provides a CMOS structure comprising a Slim spacer and method for forming the same to reduce an S/D electrical resistance and improve charge mobility in a channel region.

In a first embodiment, the method includes providing a semiconductor substrate including a polysilicon or metal gate structure including at least one overlying hardmask layer; forming spacers selected from the group consisting of oxide/nitride and oxide/nitride/oxide layers adjacent the polysilicon or metal gate structure; removing the at least one overlying hardmask layer to expose the polysilicon or metal gate structure; carrying out an ion implant process; carrying out at least one of a wet and dry etching process to reduce the width of the spacers; and, forming at least one dielectric layer over the polysilicon or metal gate structure and spacers in one of tensile and compressive stress.

In one embodiment of the present invention, a semiconductor device is provided on a substrate having a <100> crystal orientation. Current flow of device is along <100> direction. The mobility of PMOS could be enhanced on this direction.

These and other embodiments, aspects and features of the invention will be better understood from a detailed description of the preferred embodiments of the invention which are further described below in conjunction with the accompanying FIGS.

DETAILED DESCRIPTION OF THE PREFERRED EMBODIMENTS

Although the method of the present invention is explained by reference to exemplary device sizes and is most advantageously used with preferred devices sizes, including spacer widths and gate lengths, it will be appreciated that the method of the present invention may be used with other device sizes as well.

Referring to FIGS. 1A–1F is shown an exemplary implementation of the method of the present invention. Shown are a silicon or silicon germanium substrate 10, an overlying gate dielectric layer (such as oxide) portion 12, and an overlying polysilicon or metal gate electrode portion 14. In an aspect of the invention, at least one hardmask layers are deposited over a polysilicon or metal layer prior to forming the gate structure to form hardmask layer portions 16A and 16B overlying gate electrode portion 14 by conventional deposition, photolithographic and etching processes. For example the lowermost hardmask layer 16A is preferably formed of silicon oxide, e.g., LPCVD or PECVD silicon oxide and hardmask layer 16B is preferably formed of silicon nitride and/or silicon oxynitride by conventional LPCVD or PECVD processes, for example the two hardmask layer portions 16A and 16B having a total thickness of about 300 Angstroms to about 1000 Angstroms. It will be appreciated that a conventional source/drain extension (SDE) ion implant process may be carried prior to or following removal of the hardmask layer portion 16B to form SDE regions e.g., 20A, 20B as explained below.

Figure 1A:
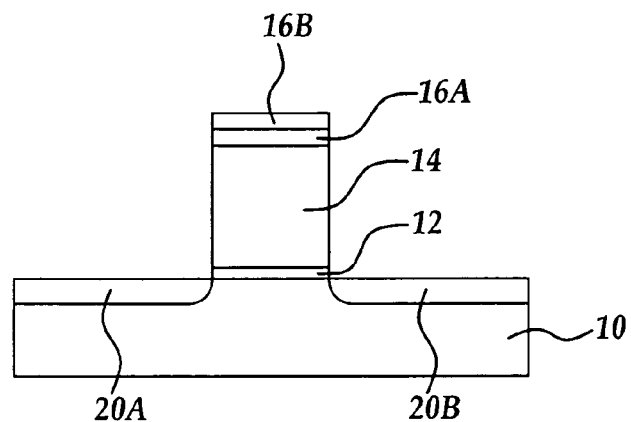
FIGS. 1A–1F are cross sectional views including a portion of a gate structure of an exemplary MOSFET showing exemplary manufacturing stages in an integrated circuit manufacturing process according to an embodiment of the present invention.
Figure 1B:
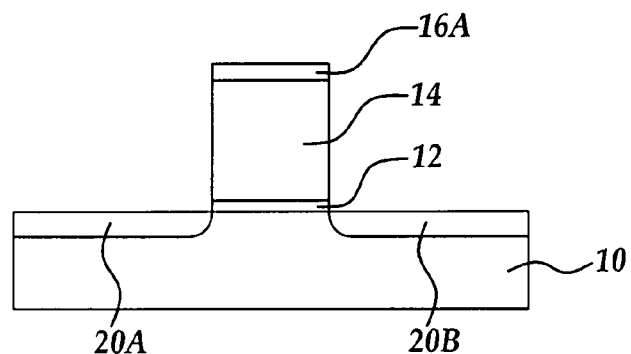

Referring to FIG. 1B, in an aspect of the invention, the uppermost hardmask layer e.g., 16B is removed by a conventional wet or dry etching process to leave the lowermost hardmask layer portion e.g., 16A overlying the polysilicon or metal electrode portion 14.

Figure 1C:
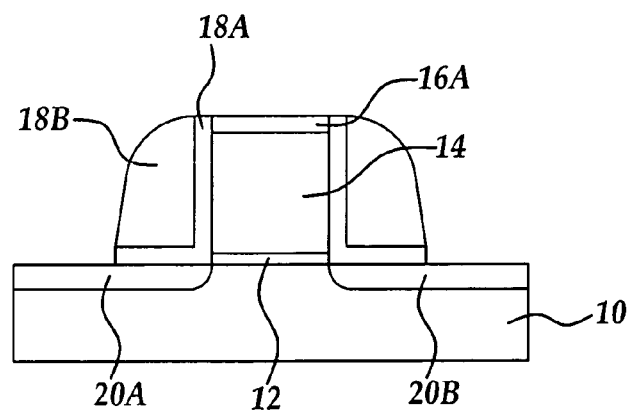

Referring to FIG. 1C, in one embodiment of the invention, an oxide layer, for example LPCVD TEOS oxide is first blanket deposited, for example having a thickness less than about 200 Angstroms, more preferably less than about 150 Angstroms, followed by deposition of a nitride layer, for example silicon nitride or silicon oxynitride (e.g., SiON), preferably silicon nitride, (e.g., $Si_3N_4$, SiN), preferably by an LPCVD process and preferably having a thickness of greater than about 450 Angstroms. A conventional wet and/or dry etchback process is then carried out to etch through a thickness of the nitride layer and underlying oxide layer to stop on the hardmask portion 16A to form nitride spacer portion e.g., 18B and oxide spacer portion e.g., 18A adjacent either side of the gate structure.

Figure 1D:
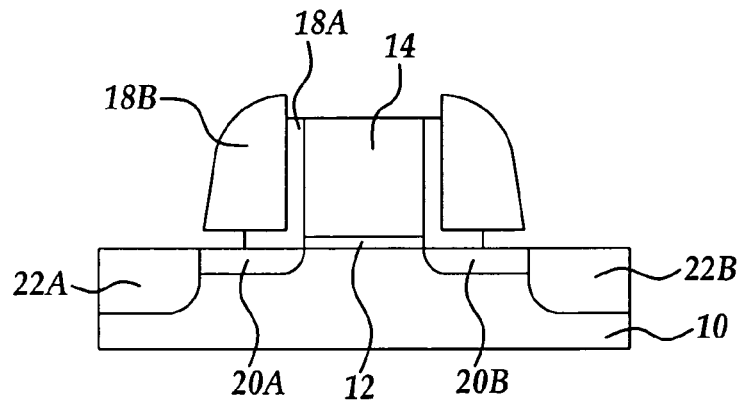

Referring to FIG. 1D, in an important aspect of the invention, a conventional wet or dry etching process, preferably a wet oxide (isotropic) etch process is then carried out, for example using dilute HF and an optional buffer agent, to remove the oxide hardmask layer portion 16A overlying the polysilicon or metal electrode portion 14. It will be appreciated that in an isotropic wet etch process a portion of the oxide spacer portion 18A will be removed as well, preferably to be about co-planar with the polysilicon or metal electrode 14 upper portion, while removing a portion underling the nitride portion 18B. Following removal of the hardmask layer portion 16A overlying the polysilicon or metal electrode portion 14, a conventional S/D ion implantation process, also referred to as a high dose implant (HDI) is then carried out to dope the polysilicon electrode or metal portion 14 as well as form the S/D regions e.g., 22a, 22B adjacent the SDE regions e.g., 20A, 20B.

Figure 1E:
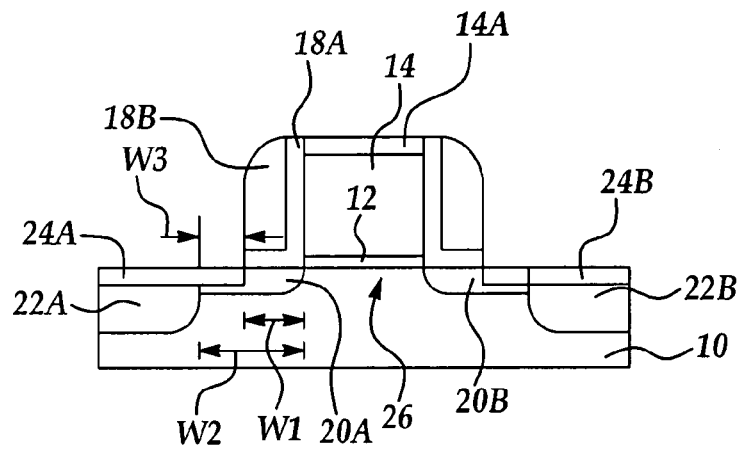

Referring to FIG. 1E, in a critical aspect of the invention, a wet or dry etching process is then carried out to remove a portion of the nitride spacer 18B, to form a Slim (reduced width) oxide/nitride spacer width from W2 to W1. Advantageously, in the spacer thinning process a portion of the underlying SDE region e.g., 20A is exposed by the reduced width amount e.g., W3. For example, a maximum width W1 of the Slim spacers is preferably less than a width W2 of the SDE doped regions e.g., 20A measured to an edge of the S/D doped region 22A. It will be appreciated that the desired reduction in width of the nitride spacer portion 18B will vary depending on the gate length and the oxide/nitride spacer width W2 present for the S/D implant process prior to thinning, a desired reduction in S/D resistance, and a desired increase in channel stress. Preferably, however, the Slim width W1 of the oxide/nitride spacer 18A and 18B measured from the polysilicon or metal gate electrode sidewall 14, is reduced by greater than about 20 percent of W2 to achieve a desired electrical resistance decrease in S/D region e.g., 22A and SDE region e.g., 20A and/or an increase in channel stress in channel region e.g., 26. In an exemplary embodiment, for a CMOS gate structure having a gate length ($L_G$), of about 400 Angstroms and a pre-Slim spacer width W2 of about 650 Angstroms, the spacer is reduced to a width W1 of less than about 500 Angstroms, more preferably less than about 350 Angstroms.

Still referring to FIG. 1E, following the wet or dry etching process to reduce the spacer width, optionally a salicide formation process is undertaken by conventional processes to form salicide regions e.g., 24A and 24B respectively over the S/D regions e.g., 22A and 22B and a portion of exposed SDE regions e.g., 20A, 20B as well as over the upper portion e.g., 14A of polysilicon electrode 14. Preferably the salicide regions are formed of $TiS_2$, $CoSi_2$ or NiSi by conventional process of depositing Ti, Co or Ni over exposed silicon and polysilicon or metal portions followed by a subsequent annealing process as is known in the art to form the low resistance phase of the respective salicide. Less preferably, the salicide formation process may be carried out subsequent to the stressed dielectric formation and removal process outlined below.

Advantageously, according to the present invention, by exposure of a portion of the underlying SED regions e.g., 20A in the spacer width reduction process, and subsequent formation of an overlying salicide portion e.g., 24A, the electrical resistance of the S/D regions e.g., 22A and SDE regions e.g., 20A are reduced, thereby allowing reduced gate length and reduced S/D and SDE junction depths to reduced short channel effects (SCE) while increasing the drive current ($I_d$). For example, the electrical operating characteristics e.g., $I_{Dsat}$ of MOSFET devices having gate lengths ($L_G$) of 80 nanometers or less are advantageously improved without accompanying SCE, according to embodiments of the present invention.

Figure 1F:
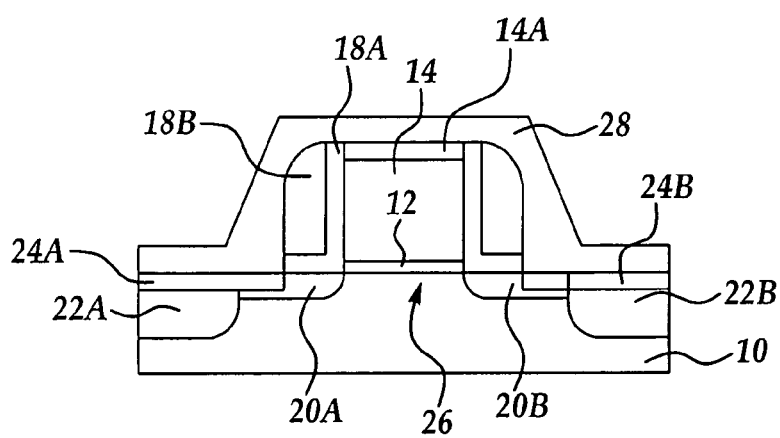

Referring to FIG. 1F, in a related embodiment of the invention, a stressed dielectric layer 28 in one of tensile or compressive stress is then formed (e.g., blanket deposited) over the gate structure including the S/D regions and SDE regions. For example, the stressed dielectric layer 28 is preferably formed in tensile stress for a NMOS device and preferably formed in compressive stress for a PMOS device. It will be appreciated that the level of the tensile or compressive stress can be varied by a number of factors including the thickness of the stressed dielectric layer 28, preferably being from about 50 Angstroms to about 1000 Angstroms in thickness up to about a 2 GPa respective stress level.

Preferably, the stressed dielectric layer 28 is deposited by a CVD process where the relative reactant flow rates, deposition pressure, and temperature may be varied to vary a composition of the dielectric layer thereby controlling the level of either tensile or compressive stress. For example, stressed dielectric layer 28 may be a nitride or carbide, such as silicon nitride (e.g., SiN, $Si_xN_y$), silicon oxynitride (e.g., $Si_xON_y$), or silicon carbide (e.g., $Si_xOC_y$) where the stoichiometric proportions x and y may be selected according to CVD process variables as are known in the art to achieve a desired tensile or compressive stress in a deposited dielectric layer. For example, the CVD process may be a low pressure chemical vapor deposition (LPCVD) process, an atomic layer CVD (ALCVD) process, or a plasma enhanced CVD (PECVD) process. The stressed dielectric layer 28 may be removed or left in place following a subsequent annealing process where amorphous portions of the polysilicon are recrystallized thereby increasing a selected stress level on the channel region e.g., 26 to improve carrier mobility.

Figure 3:
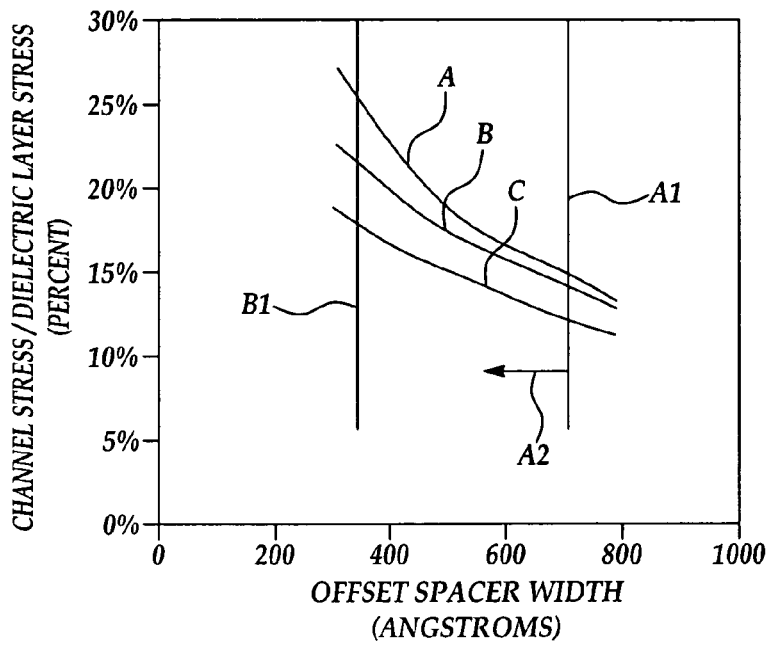
FIG. 3 is a data representation showing the gain in channel stress achieved according to the Slim spacer MOSFET device formed according to embodiments of the present invention.

Referring to FIG. 3, advantageously, according to the present invention, the selected amount of stress in the channel region can be increased significantly by reduction of spacer width according to preferred embodiments. For example, shown is a data representation of a CMOS device formed with a reduced spacer width according to embodiments of the present invention. Shown on the vertical axis is a ratio of channel stress to dielectric layer stress (e.g. 28) and on the horizontal axis is shown a spacer width formed according to preferred embodiments. Data lines A, B and C represent respective spacer widths formed for a CMOS device having respective 25 nm, 40 nm, and 80 nm gate lengths. Data to the left of line A1 (shown by directional arrow A2) represent reduced spacer widths with increased channel stress for a given dielectric layer stress according to embodiments of the present invention.

It is seen that the ratio of channel stress to dielectric layer stress (vertical axis) increases with reduced spacer width, for example increasing by up to about 60% at line B1. Therefore, advantageously, an increased level of channel stress can be formed for a given stress level of the dielectric layer following reduced spacer width formation according to embodiments of the present invention. Formation of salicides advantageously further adds to increased channel stress while reducing S/D and SDE region electrical resistance. The increased stress in the channel region, together with salicide formation, increases charge carrier mobility while reducing short channel effects (SCE) and increasing drive current ($I_D$) at smaller gate lengths.

Referring back to FIG. 2A, is shown another embodiment of the present invention. In this embodiment, the formation steps including formation of two hardmask layers 16A and 16B followed by removal of the uppermost hardmask layer 16B, and formation of SDE region e.g., 20A and 20B are the same as outlined with respect to the embodiment shown in FIGS. 1A and 1B.

Figure 2A:
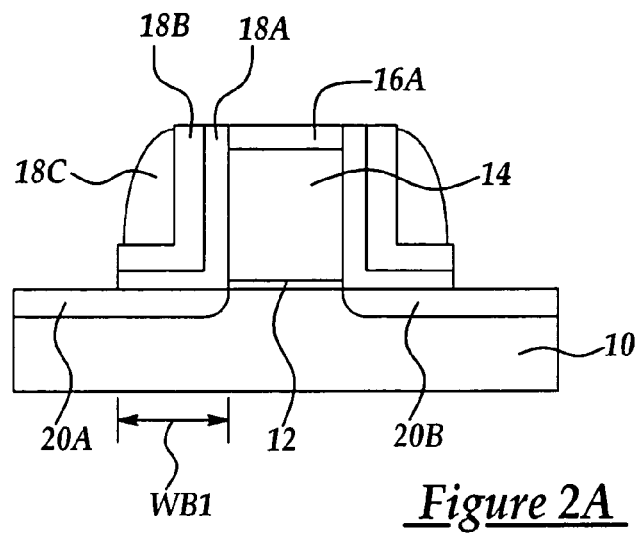
FIGS. 2A–2E are cross sectional views including a portion of a gate structure of an exemplary MOSFET showing exemplary manufacturing stages in an integrated circuit manufacturing process according to an embodiment of the present invention.

Still referring to FIG. 2A, in the present embodiment, oxide/nitride/oxide spacers are formed of the same preferred materials outlined for the oxide/nitride spacers in the embodiment shown in FIG. 1, but additionally including deposition of an uppermost oxide layer to form oxide portion e.g., 18C following conventional wet and/or dry etchback process. The maximum width WB1 of the oxide/nitride/oxide spacers prior to width reduction as measured from the polysilicon or metal electrode 14 sidewall portion is for example, greater than about 450 Angstroms.

Figure 2B:
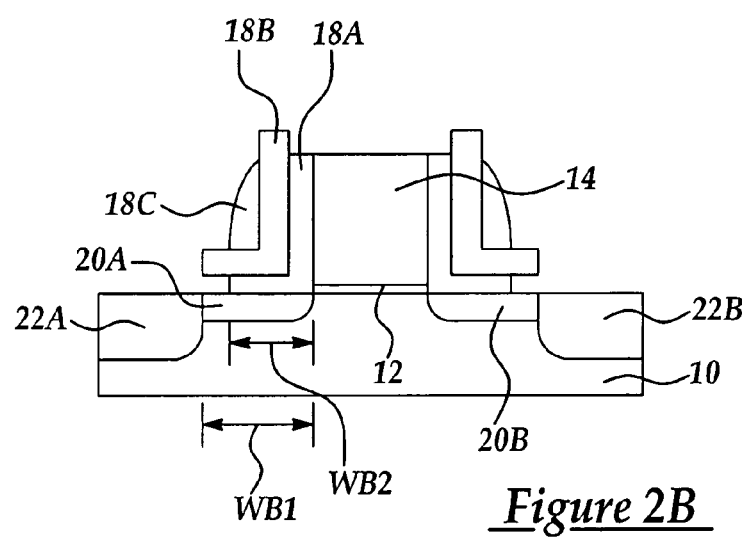

Referring to FIG. 2B, a conventional oxide wet or dry etching process, preferably an isotropic wet etch process, is first carried out to remove the hardmask layer 16A oxide hardmask layer over the polysilicon electrode 14 as well as removing portions of the spacer oxide portions 18A and 18C. Preferably the oxide portions are removed to a desired reduction in width of the oxide/nitride/oxide spacers e.g., WB1 to WB2. A high dose implant (HDI) process is then carried out to dope the polysilicon or metal gate electrode 14 as well as forming the S/D regions e.g., 22A and 22B. It will be appreciated that amorphous polysilicon regions may be formed in the polysilicon or metal electrode portion 14 during the HDI process.

Figure 2C:
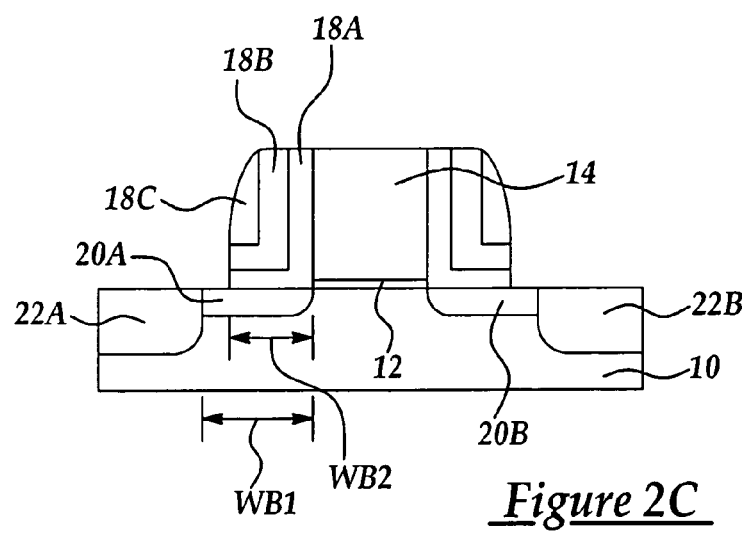

Referring to FIG. 2C, the nitride portion e.g., 18B of spacer width WB1 is then reduced by a conventional nitride wet or dry etch to form reduced oxide/nitride/oxide spacer width WB2, preferably less than about 500 Angstroms in width, more preferably less than about 400 Angstroms in width, measured at a maximum width of the spacer from the polysilicon or metal gate sidewall. Advantageously, in the spacer thinning process a portion of the underlying SDE region e.g., 20A is exposed, for example an exposed width of the underlying SDE region being about equal to the amount by which the spacer width is Slim.

Figure 2D:
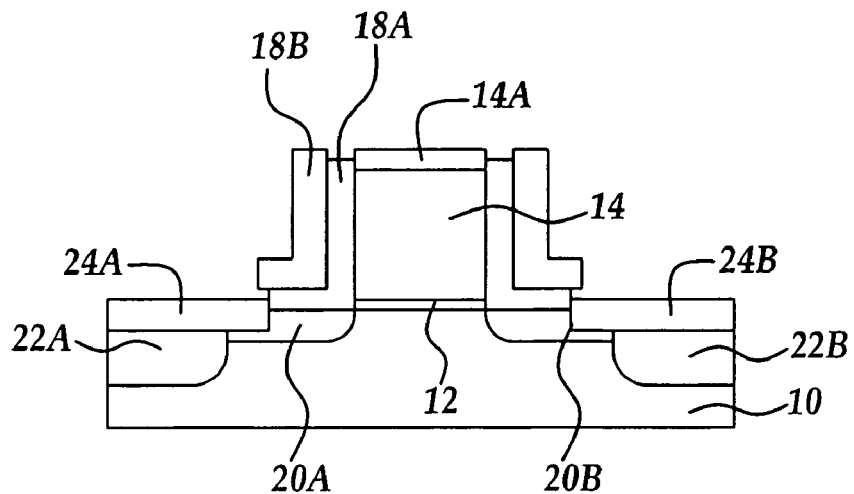

Referring to FIG. 2D, a conventional oxide wet etch process for example a dip in dilute HF is then carried out to remove remaining portions of the oxide portion e.g., 18C of the spacer, including any oxide portions overlying the silicon substrate 10 to form oxide/nitride spacers having substantially vertical sidewall portions e.g., oxide/nitride portions 18A and 18B. A salicide formation process is then preferably carried out by the same process as previously outlined to form salicide regions e.g., 24A, 24B, and 14A in the same manner as previously outlined in FIG. 1E, advantageously extending into a portion of the SDE region e.g., 20A.

Figure 2E:
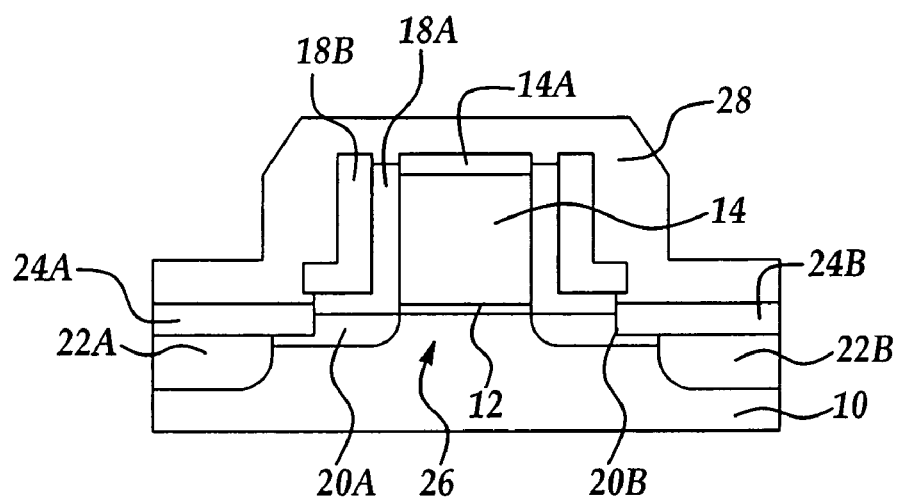

Referring to FIG. 2E, a stressed dielectric layer 28, optionally including an underlying oxide buffer layer, is then deposited, annealed, and subsequently optionally removed to form a stressed channel region e.g., 26 in the same manner and according to the same preferred embodiments as outlined above for FIG. 1F.

Thus, a method for producing reduced width spacers in a CMOS device manufacture process has been presented that allows adjustable control over the width of the spacer prior to forming an overlying stressed dielectric layer and salicide portions. Advantageously, the width of the spacer may be selected to achieve a desired electrical resistance over the S/D and SDE regions as well as achieving a desired increase in compressive or tensile stress in the channel region. The method is cost effective since the number of required steps is limited and the process uses conventional materials and etching processes.

Figure 4:
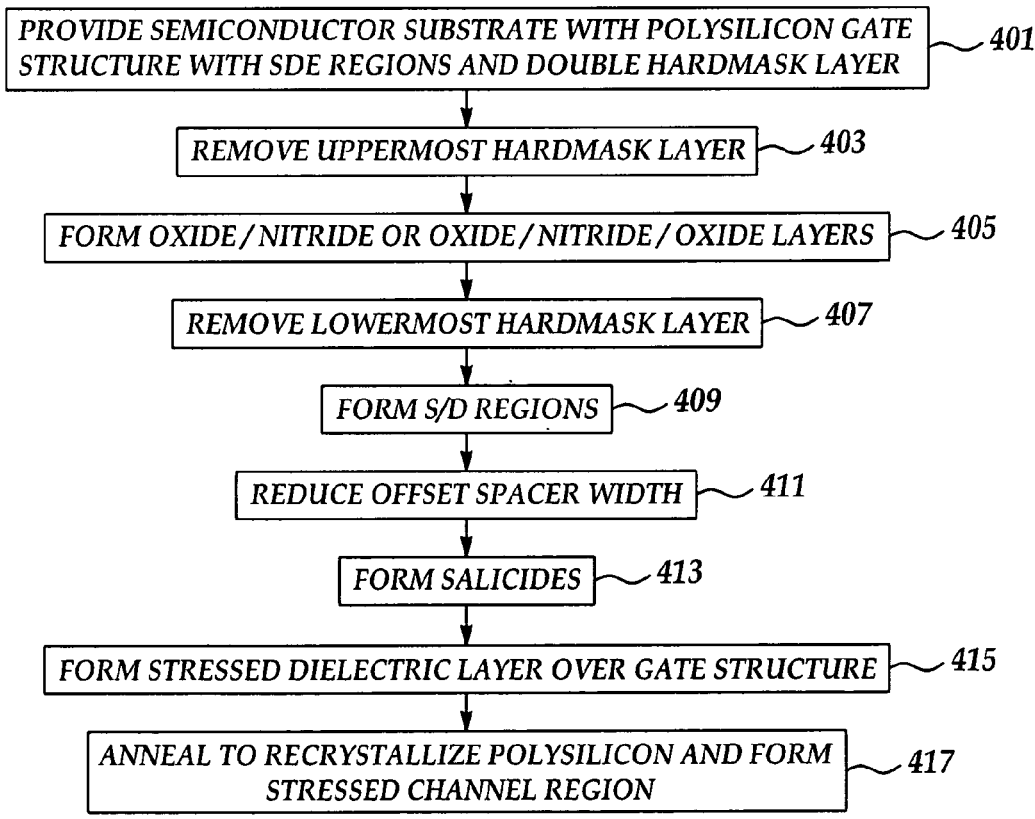
FIG. 4 is a process flow diagram including several embodiments of the present invention.

Referring to FIG. 4 is a process flow diagram including several embodiments of the present invention. In process 401, a silicon substrate including a CMOS gate structure is provided with SDE doped portions and a double layer hardmask layer overlying the polysilicon or metal electrode portion. In process 403, the uppermost hardmask layer is removed. In process 405, an oxide/nitride or oxide/nitride/oxide spacer is formed. In process 407, the lowermost hardmask layer is removed. In process 409 a high dose implant (HDI) process is carried out to dope the polysilicon layer and form S/D regions. In process 411, the spacers are Slim (width reduced) to a predetermined width according to preferred embodiments. In optional process 413, salicides are formed over S/D regions including SDE regions and the uppermost polysilicon or metal electrode portion. In process 415 a stressed dielectric layer is formed over the CMOS gate structure including Slim spacers. In process 417, an annealing process is carried out to recrystallize amorphous polysilicon or metal electrode portions to create a predetermined stress type (tensile or compressive) and stress level in the channel region underlying the CMOS polysilicon or metal gate structure.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A semiconductor device comprising:
   a substrate having a surface orientation of (100);
   a gate electrode formed on the substrate;
   Slim spacers formed on the top of the substrate adjacent either side of the gate electrode, said Slim spacers thinned to control a channel stress;
   wherein source/drain regions are oriented having a source-to-drain axis along the <100> direction; and,
   wherein at least one dielectric tensile-stress film is provided over the gate electrode and spacers exerting a tensile stress at a magnitude of about 50 MPa to about 2 GPa.

2. The semiconductor device of claim 1, wherein the width of the slim spacers is less than about 500 Angstroms.

3. The semiconductor device of claim 1, wherein the gate electrode comprises a gate structure having a gate length of less than about 80 nanometers.

4. The semiconductor device of claim 1, wherein said slim spacers have a top portion at about the same level as the top portion of the gate electrode.

5. A semiconductor device comprising:
   a substrate having a surface orientation of (100);
   a gate electrode formed on the substrate;
   Slim spacers formed on the top of the substrate adjacent the gate electrode, said Slim spacers thinned to expose portions of underlying source/drain extension regions (SDE);
   wherein source/drain regions are oriented having a source-to-drain axis along the <100> direction; and
   at least one tensile-stress film over the gate electrode and Slim spacers wherein the tensile-stress film exerts a tensile stress at a magnitude of about 50 MPa to about 2 GPa.

6. The semiconductor device of claim 5, wherein the width of the Slim spacers is less than about 500 Angstroms.

7. The semiconductor device of claim 5, wherein the gate electrode comprises a gate structure having a gate length of less than about 80 nanometers.

8. The semiconductor device of claim 1, wherein the gate electrode comprises a PMOS device.

9. The semiconductor device of claim 1, wherein the Slim spacers have a width that is less than the width of the SDE regions by greater than about 20 percent.

10. The semiconductor device of claim 1, further comprising salicide portions on the SDE regions.

11. The semiconductor device of claim 1, wherein the tensile-stress film is selected from the group consisting of silicon oxide, silicon nitride, silicon oxynitride, silicon carbide, and silicon oxycarbide.

12. The semiconductor device of claim 5, wherein said slim spacers have a top portion at about the same level as the top portion of the gate electrode.

13. A CMOS structure having a reduced S/D electrical resistance and increased charge carrier mobility in a channel region comprising:
   a semiconductor substrate;
   a gate structure formed overlying the semiconductor substrate comprising a gate electrode;
   thinned spacers adjacent either side of the electrode comprising an oxide/nitride portion adjacent the electrode;
   wherein the width of said thinned spacers is adjusted to control a subsequent stress exerted on a channel region underlying the gate electrode;
   wherein said thinned spacers have a top portion at about the same level as the top portion of the gate electrode;
   wherein source/drain extension (SDE) regions comprising the semiconductor substrate extend beyond a maximum width of the spacers; and,
   at least one stressed dielectric layer disposed overlying the gate structure including said thinned spacers to exert a stress through said thinned spacers on said channel region.

14. The CMOS structure of claim 13, wherein the at least one stressed dielectric layer is in one of tensile and compressive stress.

15. The CMOS structure of claim 13, wherein the at least one stressed dielectric layer is selected from the group consisting of silicon oxide, silicon nitride, silicon oxynitride, silicon carbide, and silicon oxycarbide.

16. The CMOS structure of claim 13, further comprising salicide portions comprising a portion of the SDE doped regions.

17. The CMOS structure of claim 13, wherein the gate structure gate length is less than about 80 nm.

18. The CMOS structure of claim 13, wherein the maximum width of the thinned spacers is less than about 500 Angstroms.

19. The CMOS structure of claim 13, wherein the maximum width of the thinned spacers is less than about 400 Angstroms.

20. The CMOS structure of claim 13, wherein the oxide portion comprises CVD silicon oxide.

21. The CMOS structure of claim 13, wherein the nitride portion is selected from the group consisting of CVD silicon nitride and CVD silicon oxynitride.

22. The CMOS structure of claim 13, wherein the thinned spacers comprises substantially vertical sidewalls.

23. The CMOS structure of claim 13, wherein the gate structure comprises a PMOS device and the stressed dielectric layer in tensile stress.

24. The CMOS structure of claim 13, further comprising source/drain regions oriented having a source-to-drain axis along the <100> direction.

25. The CMOS structure of claim 13, wherein the thinned spacers have a width that is less than the width of the SDE regions by greater than about 20 percent.

* * * * *